US012812776B2

(12) United States Patent
Tan et al.

(10) Patent No.: US 12,812,776 B2
(45) Date of Patent: Nov. 24, 2026

(54) PIN STRUCTURE OF MODULE POWER SUPPLY, AND MODULE POWER SUPPLY

(71) Applicant: MORNSUN GUANGZHOU SCIENCE & TECHNOLOGY CO., LTD., Guangdong (CN)

(72) Inventors: Youyuan Tan, Guangdong (CN); Wenjie Liang, Guangdong (CN)

(73) Assignee: MORNSUN GUANGZHOU SCIENCE & TECHNOLOGY CO., LTD., Guangzhou (CN)

( * ) Notice: Subject to any disclaimer, the term of this patent is extended or adjusted under 35 U.S.C. 154(b) by 420 days.

(21) Appl. No.: 18/700,659

(22) PCT Filed: Sep. 28, 2022

(86) PCT No.: PCT/CN2022/122038
§ 371 (c)(1),
(2) Date: Apr. 11, 2024

(87) PCT Pub. No.: WO2023/098266
PCT Pub. Date: Jun. 8, 2023

(65) Prior Publication Data
US 2025/0008648 A1 Jan. 2, 2025

(30) Foreign Application Priority Data
Nov. 30, 2021 (CN) ........................ 202111450979.9

(51) Int. Cl.
*H05K 1/11* (2006.01)

(52) U.S. Cl.
CPC ....... *H05K 1/11* (2013.01); *H05K 2201/1034* (2013.01)

(58) Field of Classification Search
CPC ......................... H05K 1/11; H05K 2201/1034
(Continued)

(56) References Cited

U.S. PATENT DOCUMENTS

| | | | |
|---|---|---|---|
| 9,875,991 | B2 | 1/2018 | Liang et al. |
| 2023/0209712 | A1 | 6/2023 | Tan et al. |

FOREIGN PATENT DOCUMENTS

| | | | |
|---|---|---|---|
| CN | 2911960 | Y | 6/2007 |
| CN | 101226890 | A | 7/2008 |

(Continued)

OTHER PUBLICATIONS

CN Office Action dated Nov. 28, 2025 of patent application No. 202111450979.9.

(Continued)

*Primary Examiner* — Andargie M Aychillhum
(74) *Attorney, Agent, or Firm* — Maschoff Brennan

(57) ABSTRACT

A pin structure of a module power supply, and a module power supply, wherein the pin structure comprises: a plastic body, wherein the plastic body is provided with an accommodating region; metal pins, wherein the metal pins are integrally connected with the plastic body and located at the accommodating region, a first surface of each metal pin is attached to the plastic body, and a second surface of the metal pin opposite to the first surface is exposed outside the plastic body; and an interlocking structure, comprising a protrusion and a recess, one of the protrusion and the recess being located on the plastic body, the other of the protrusion and the recess being located on the metal pin, the protrusion extending into the recess to form an interlock to prevent the metal pin from slipping off the plastic body.

15 Claims, 8 Drawing Sheets

(58) Field of Classification Search
USPC .......................................................... 174/261
See application file for complete search history.

(56) References Cited

FOREIGN PATENT DOCUMENTS

| | | | | | |
|---|---|---|---|---|---|
| CN | 106298695 A | | 1/2017 | | |
| CN | 108521037 A | | 9/2018 | | |
| CN | 112839437 A | | 5/2021 | | |
| CN | 213304121 U | | 5/2021 | | |
| CN | 114420648 A | * | 4/2022 | ............ | H10W 72/00 |
| JP | 2008282904 A | | 11/2008 | | |
| TW | 201216416 A | | 4/2012 | | |

OTHER PUBLICATIONS

International Search Report and Written Opinion of the International Searching Authority dated Dec. 7, 2022 as received in Application No. PCT/CN2022/122038.

* cited by examiner

PIN STRUCTURE OF MODULE POWER SUPPLY, AND MODULE POWER SUPPLY

TECHNICAL FIELD

The present invention relates to the technical field of module power supplies, in particular relates to a pin structure of a module power supply, and a module power supply.

BACKGROUND

In the field of module power supply products made by using the existing double-sided plastic encapsulation process, when the plastic encapsulation body and the PCB have the same size, a pin is led from one side of the power supply product, and the pin structure is generally divided into the following two types.

For the first type, the metal pin and the plastic body is separated, and the metal pin should be welded to the product first, and then the plastic body serving as a lid is assembled on the product. The assembly process of this pin structure is complex, requiring at least 2 steps of assembly, which result in too many steps of assembly process and long working time. This structure has requirements for the thickness and size of the metal pin. When the thickness of the metal pin is thin, for example, the thickness of the metal pin is 0.25 mm and the metal pin is long, the metal pin is easy to deform, which increases the difficulty of welding and assembly of the metal pin and adversely affects the appearance of the product.

For the second type, the metal pin and the plastic body are integrally formed by injection molding or compression molding. In this scheme, although because the metal pin and the plastic body are integrally injected/molded into one piece and thus the assembly process can be reduced, however, both sides of the metal pin are generally wrapped by a plastic body in a thickness direction of the metal pin. Due to the integrity requirements of injection molding, the thickness of the molded metal pin is relatively thick, generally greater than a sum of the thickness of the metal pin and twice the thickness of the plastic body. The increase in molded pin thickness will result in the increase in product size. And for this pin structure, when the overall size of the product has certain requirements, it would be necessary to reduce the size of the PCB, and thus the layout space for components would be reduced.

SUMMARY

The objective of the present invention is to provide a pin structure of a module power supply and a module power supply to solve the problems in the prior art that the pin thickness of a module power supply is relatively thick and that the metal pins are difficult to weld and assemble.

In order to achieve the above objective, according to one aspect of the present invention, a pin structure of a module power supply is provided, which comprises a plastic body, provided with an accommodating region; a metal pin, integrally connected with the plastic body and located at the accommodating region; a first surface of the metal pin being attached to the plastic body, and a second surface of the metal pin opposite to the first surface being exposed outside the plastic body; an interlocking structure, comprising a protrusion and a recess; one of the protrusion and the recess being located on the plastic body, and the other of the protrusion and the recess being located on the metal pin; the protrusion extending into the recess to form an interlock to prevent the metal pin from slipping off the plastic body.

Preferably, the metal pin is provided with the protrusion, the protrusion is located at a peripheral edge of the metal pin and extends along the first surface, and a thickness of the protrusion is less than that of the metal pin, the plastic body is provided with the recess; the protrusion is continuously arranged along a periphery of the metal pin, or the pin structure comprises a plurality of the protrusions arranged along a periphery of the metal pin at intervals.

Preferably, a difference between a thickness of the protrusion and a thickness of the metal pin is greater than or equal to 0.4 mm.

Preferably, the metal pin is provided with a through hole and one part of the plastic body is located in the through hole.

Preferably, the metal pin comprises an attaching part and a connecting part, and the attaching part and at least a portion of the connecting part are arranged in the accommodating region; one surface of the attaching part and a surface of a portion of the connecting part constitute the first surface.

Preferably, one part of the metal pin bends and protrudes in a direction towards a center of the plastic body, and one side of the bending protruding part of the metal pin that is away from the center of the plastic body serves as the recess, and the plastic body is provided with the protrusion.

Preferably, the recess is located on the second surface, the recess and the protrusion both extend along a width direction of the metal pin, and the protrusion is connected to two opposite lateral sides of the accommodating region.

Preferably, a pass hole is provided at a location where the metal pin protrudes, and one part of the protrusion is located in the pass hole and is connected to one side of the accommodating region that faces the first surface.

Preferably, the metal pin comprises a first segment and a second segment that bend in sequence, the second segment bends in a direction towards the center of the plastic body, the first segment has the first surface and the second surface; both surfaces of the second segment are in contact with the plastic body, and one side of the second segment away from the center of the plastic body serves as the recess.

Preferably, a thickness of the part of the plastic body that corresponds to the bending protruding part of the metal pin is greater than or equal to 0.4 mm.

Preferably, the metal pin is provided with the protrusion located on the first surface and protruding towards the plastic body, and the plastic body is provided with the recess; the protrusion is integrally formed with the metal pin, or the protrusion is separately machined and connected to the metal pin.

Preferably, a size of one end of the protrusion adjacent to the first surface is smaller than that of the other end thereof away from the first surface; and/or the protrusion bends and hooks into the recess.

Preferably, the protrusion is provided with a connecting hole having an axis not vertical with the first surface, and one part of the plastic body is located in the connecting hole.

Preferably, the metal pin is provided with a joint hole serving as the recess, a diameter of the joint hole is gradually decreasing along a direction towards the plastic body, and the plastic body is provided with the protrusion.

According to another aspect of the present invention, a module power supply is provided, which comprises a product body, and a plurality of pin structures mentioned above, wherein, both opposite sides of the product body are provided with the pin structures.

In the technical solution of the present invention, an interlocking structure is provided, and a protrusion and a recess of the interlocking structure can be arranged on the plastic body and the metal pin respectively according to the needs, when the plastic body and the metal pin are integrally formed by injection molding or compression molding, the protrusion extends into the recess to form an interlock between the protrusion and the recess, which helps to achieve a reliable connection between the plastic body and the metal pin, and reduces the frequency of pin assembling, so as to achieve convenient and fast assembling, and also helps to prevent the metal pin from falling off from the plastic body and improve the resistance to mechanical vibration after the pin assembling, and meanwhile, the first surface of the metal pin is attached to the plastic body, and the second surface is exposed outside the plastic body, so as to allow the metal pin to be directly in contact with the product, thereby ensuring good heat dissipation performance while ensuring the reliability of connection between the metal pin and the plastic body. And the thickness of the pin structure is equal to the sum of the thickness of the metal pin and the thickness of the plastic body on one side of the metal pin, therefore, when the product size is certain, the layout size of the Printed Circuit Board (PCB) is increased, and, since the molded pin thickness is reduced, a reduced overall product size can be realized.

BRIEF DESCRIPTION OF DRAWINGS

The accompanying drawings of the specification forming part of the present disclosure are used to provide a further understanding of the present invention, and the schematic embodiments of the present invention and the descriptions thereof are used to explain the present invention, which would not constitute inappropriate limitation to the present invention. In the drawings.

Figure 1:
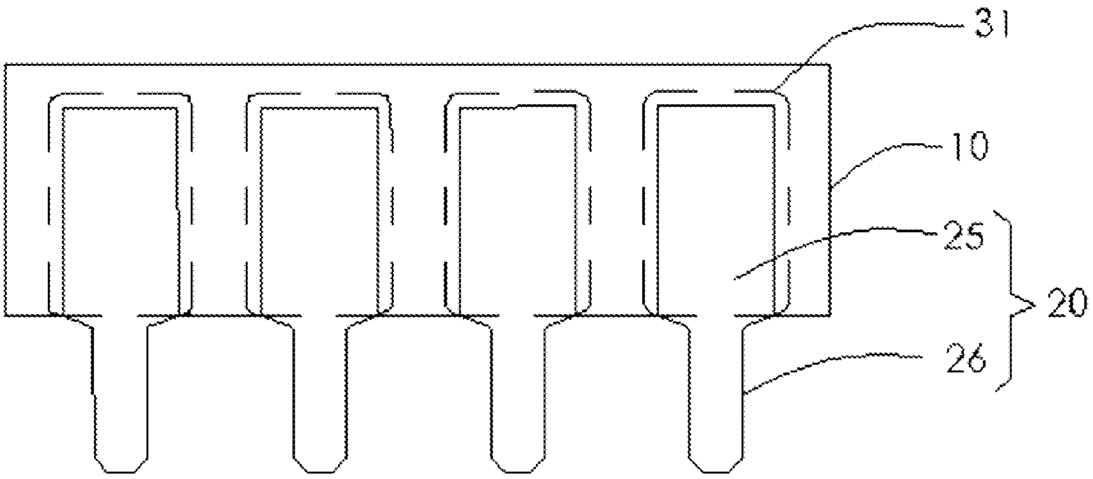
FIG. 1 is a view of the pin structure of Embodiment 1 of the present invention.

wherein, the above drawings include the following reference signs:

10-plastic body; 20-metal pin; 21-first surface; 22-second surface; 23-through hole; 24-pass hole; 25-attaching part; 26-connecting part; 31-protrusion; 311-connecting hole; 32-recess; 40-product body; 41-Printed Circuit Board (PCB); 42-plastic encapsulation body;

DETAILED DESCRIPTION OF SPECIFIC EMBODIMENTS

It should be noted that, where there is no conflict, various embodiments of the present invention and features therein can be combined with each other. The present invention is described in detail below with reference to the appended drawings and in conjunction with embodiments.

It should be noted that, unless otherwise specified, all the technological and scientific terms used in this disclosure have the same meaning as would normally be understood by a person with ordinary skill in the art to which this disclosure belongs.

In the present invention, in the absence of a statement to the contrary, positional words used such as “above”, “bottom”, “top”, “bottom” usually refer to the direction shown in the drawings, or refer to the component itself oriented in the vertical, perpendicular, or gravity direction; Similarly, for ease of understanding and describing, “inside” and “outside” refer to the inside and outside relative to the profile of respective components, but the above positional terms are not used to limit the present invention.

In order to solve the problems in the prior art that the pin thickness of a module power supply is relatively thick and that the metal pins are difficult to weld and assemble, the present invention provides a pin structure of a module power supply, and a module power supply.

Embodiment 1

Figure 2:
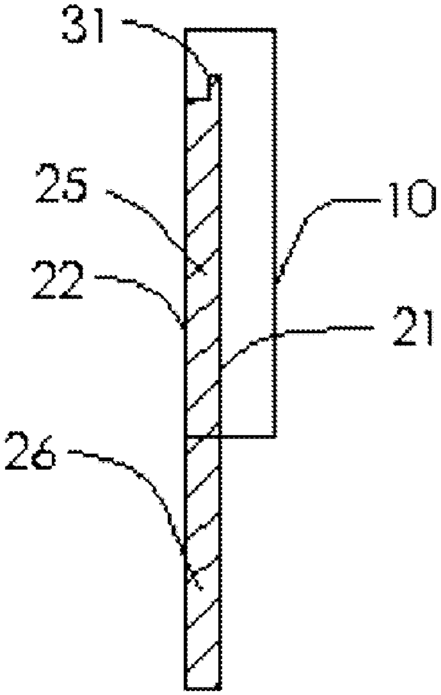
FIG. 2 is a side view of the metal pin in FIG. 1.
Figure 3:
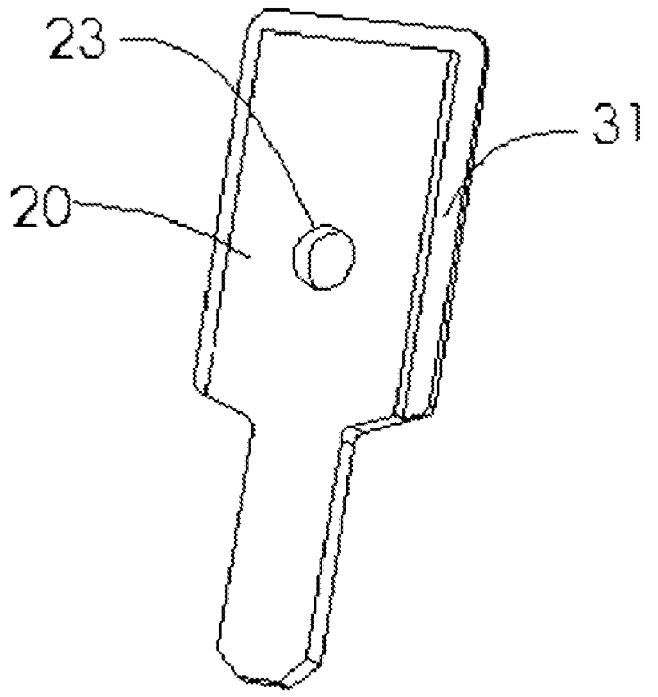
FIG. 3 is a structural view of the metal pin in FIG. 1.

Referring to FIGS. 1-3, a pin structure of a module power supply comprises a plastic body 10, a metal pin 20 and an interlocking structure, the plastic body 10 is provided with an accommodating region; the metal pin 20 is integrally connected with the plastic body 10 and located at the accommodating region; a first surface 21 of the metal pin 20 is attached to the plastic body 10, and a second surface 22 of the metal pin 20 opposite to the first surface 21 is exposed outside the plastic body 10; an interlocking structure comprises a protrusion 31 and a recess 32; one of the protrusion 31 and the recess 32 is located on the plastic body 10, and the other of the protrusion 31 and the recess 32 is located on the metal pin 20; the protrusion 31 extends into the recess 32 to form an interlock to prevent the metal pin 20 from slipping off the plastic body 10.

In the technical solution of this embodiment, an interlocking structure is provided, and a protrusion 31 and a recess 32 of the interlocking structure can be arranged on the plastic body 10 and the metal pin 20 respectively according to the needs, when the plastic body 10 and the metal pin 20 are integrally formed by injection molding or compression molding, the protrusion 31 extends into the recess 32 to form an interlock between the protrusion 31 and the recess 32, which helps to achieve a reliable connection between the plastic body 10 and the metal pin 20, and reduces the frequency of pin assembling, so as to achieve convenient and fast assembling, and also helps to prevent the metal pin 20 from falling off from the plastic body 10 and improve the resistance to mechanical vibration after the pin assembling, and meanwhile, the first surface of the metal pin 20 is attached to the plastic body 10, and the second surface 22 is exposed outside the plastic body 10, so as to allow the metal pin 20 to be directly in contact with the product, thereby ensuring good heat dissipation performance while ensuring the reliability of connection between the metal pin 20 and the plastic body 10. And the thickness of the pin structure is equal to the sum of the thickness of the metal pin 20 and the thickness of the plastic body 10 on one side of the metal pin 20, therefore, when the product size is certain, the layout size of the Printed Circuit Board (PCB) is increased, and, since the molded pin thickness is reduced, a reduced overall product size can be realized.

Generally, the metal pin 20 as a whole is in the form of a sheet with a certain thickness. Referring to FIG. 2, the metal pin 20 comprises an attaching part 25 and a connecting part 26, wherein, the attaching part 25 has a relatively large area and the connecting part 26 has a relatively small area. The attaching part 25 is mainly for attaching to the plastic part 10, and the connecting part 26 is mainly for cooperating with the product and other peripherals. When being integrally formed, the attaching part 25 is arranged in the accommodating region and two opposite sides of the attaching part 25 respectively are a first surface 21 and a second surface 22. The first surface 21 and the second surface 22 are arranged in parallel, and the second surface 22 is on the same plane as an exterior surface of the plastic body 10. In the interlocking structure, the part on the metal pin 20 is arranged on the attaching part 25 thereof, so as to facilitate the interlocking with plastic body 10. The connecting part 26 is not in cooperation with the plastic body 10, thus, the connecting part 26 is located outside the accommodating region and exposed outside the plastic body 10, so as to facilitate its cooperation with the peripherals.

In order to facilitate the subsequent explanation of limiting directions, this embodiment takes FIG. 1 as a reference. From the perspective of an ordinary person, the direction perpendicular to the first surface 21 is defined as the front and back direction, the direction parallel to the first surface 21 and extending horizontally is defined as the left and right direction, and the direction parallel to the first surface 21 and extending vertically is defined as the up and down direction.

In this embodiment, the metal pin 20 is provided with the protrusion 31, and the plastic body 10 is provided with the recess 32. Specifically, the protrusion 31 is located at a peripheral edge of the metal pin 20 and extends along the first surface 21, and is parallel to the first surface 21, so as to form a stepped structure at the edge of metal pin 20. Accordingly, a recess 32 is arranged on the side edge of the accommodating region, and the protrusion 31 is accommodated in the recess 32, so that, by the recess 32 stopping the protrusion 31, the metal pin 20 is prevented from slipping off the plastic body 10 in the front and back direction. The peripheral edge herein refers to a side edge of the metal pin 20 in a thickness direction, that is, a side edge adjacent to the first surface 21.

Preferably, a thickness of the protrusion 31 is less than that of the metal pin 20, thus, a stepped structure is formed at the protrusion 31, the recess 32 surrounds the protrusion 31. The outer flange edge of the recess 32 abuts against the stepped structure, so as to ensure the effect of interlock with the protrusion 31. More preferably, in this embodiment, a surface of the protrusion 31 in the same orientation as that of the first surface 21 is flush with the first surface 21, and the opposite surface thereof is parallel to, but not flush with, the second surface 22, so as to form the above-mentioned stepped structure between the opposite surface thereof and the second surface 22. Certainly, the specific relative position between the protrusion 31 and respective one of the first surface 21 and the second surface 22 can be adjusted according to the needs.

Preferably, a difference between a thickness of the protrusion 31 and a thickness of the metal pin 20 is greater than or equal to 0.4 mm, so as to improve the effect of interlock between the protrusion 31 and the recess 32.

In this embodiment, the protrusion 31 is continuously arranged along a periphery of the metal pin 20. Specifically, an edge on one side of the attaching part 25 is connected with the connecting part 26, all the other three sides have the protrusion 31 formed thereon, thus, the protrusion 31 has a large contacting zone with the recess 32, so as to achieve a more reliable interlocking effect. However, such an interlock between the protrusion 31 and the recess 32 is only able to restrict the movement in the front and back direction and the left and right direction, but has a poor effect of restricting the movement in a up and down direction. On this basis, in this embodiment, a through hole 23 is also provided in the attaching part 25 of the metal pin 20, as shown in FIG. 3, the through hole 23 runs through both sides of the metal pin 20 in a thickness direction thereof, thus, when the plastic body 10 and the metal pin 20 are integrally formed, one part of plastic body 10 is located in through hole 23 to form a stop fitting with the through hole 23, so as to restrict the up and down movement of the metal pin 20, which cooperates with the interlock between the protrusion 31 and recess 32 to prevent the metal pin 20 from slipping off the plastic body 10 in all of the up and down direction, the front and back direction and the left and right direction, thereby ensuring the reliability of its connection with the plastic body 10.

The protrusion 31 of this embodiment may be formed by the process of stamping or etching according to the needs. Specifically, when the stamping process is adopted, the metal pin 20 is stamped at the periphery to form a thin protrusion 31. When the etching process is adopted, the metal pin 20 is etched at the periphery to achieve a reduced thickness to form a thin protrusion 31. Relatively speaking, the etching process can produce the protrusion 31 with a higher precision and can be performed on a thinner metal pin 20.

Figure 4:
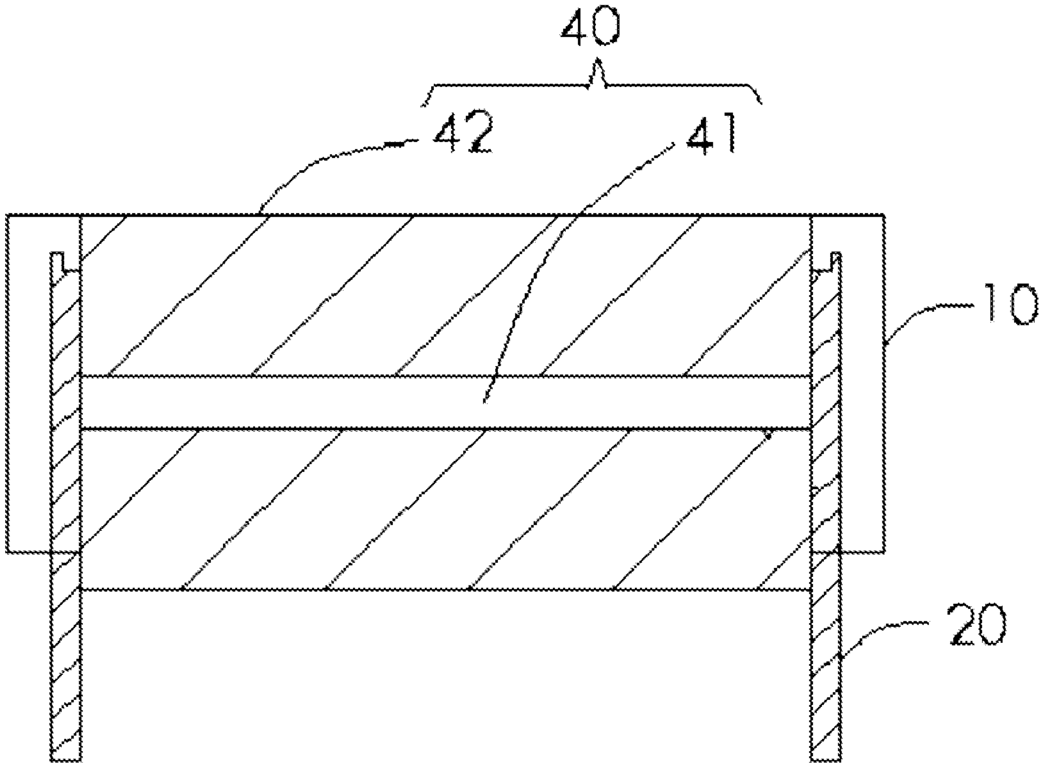
FIG. 4 is a view of the module power supply of the present invention that adopts the pin structure of Embodiment 1.

Referring to FIG. 4, this embodiment also provides a module power supply, comprising a product body 40, and a plurality of pin structures as described above. The product body 40 in this embodiment comprises a Printed Circuit Board (PCB) 41 and a plastic encapsulation body 42 which is substantially the same as the plastic body 10 of the pin structure. The PCB 41 is arranged inside the plastic encapsulation body 42 so as to constitute the product body 40, and both opposite sides of the product body 40 are provided with the pin structures.

Embodiment 2

This embodiment differs from Embodiment 1 in the specific arrangement of the protrusion 31.

Figure 5:
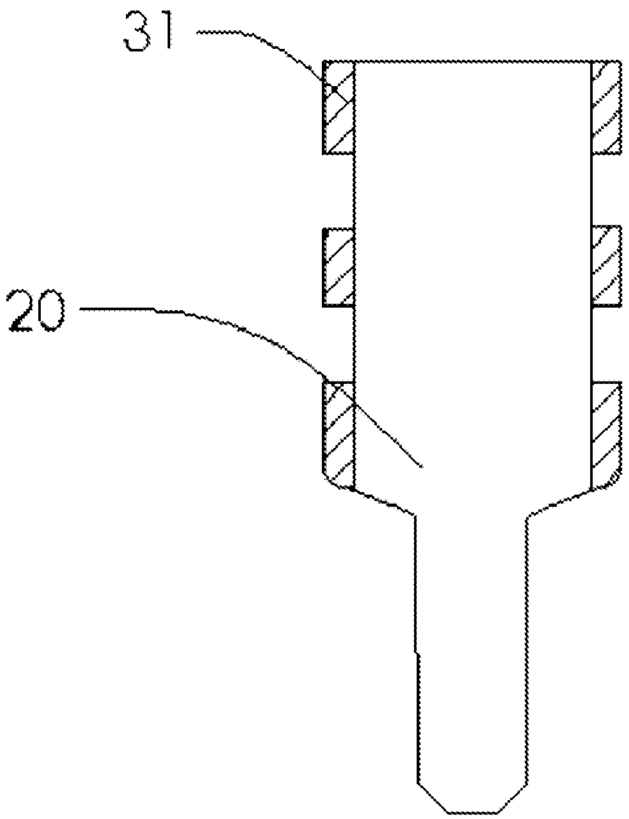
FIG. 5 is a view of the structure of the metal pin of the pin structure of Embodiment 2 of the present invention.

Referring to FIG. 5, in this embodiment, a plurality of the protrusions 31 are not continuously arranged along the periphery of the metal pin 20, but non-continuously arranged. Every two adjacent protrusions 31 have an interval provided therebetween in a circumferential direction of the metal pin 20. Accordingly, a plurality of the recesses 32 are arranged on the plastic body 10 along the periphery edge of the accommodating region at intervals, so as to allow the recesses 32 to cooperate with the protrusions 31 in a one-to-one correspondence. During the process of machining, a recess 32 is naturally formed with respect to each protrusion 31. Thus, every two adjacent protrusions 31 have part of the plastic body 10 filled in the interval formed therebetween. Such an interlock between the protrusions 31 and the recesses 32 is not only able to restrict the movement of the metal pin 20 in the front and back direction and the left and right direction, but also able to restrict the movement of the metal pin 20 in the up and down direction, so as to achieve the effect of preventing the metal pin 20 from slipping off the plastic body 10 in all of the up and down direction, the front and back direction and the left and right direction by means of the interlock between the protrusions 31 and the recesses 32. In this embodiment, the through hole 23 of Embodiment 1 can be dispensed with.

Embodiment 3

This embodiment differs from Embodiment 1 in the way of restricting the movement in the up and down direction.

In this embodiment, the accommodating region not only accommodates the attaching part 25, but also accommodates the connecting part 26 therein. Specifically, the attaching part 25 and a portion of the connecting part 26 adjacent to the attaching part 25 are both located in the accommodating region. Thus, a portion of the connecting part 26 and the entire attaching part 25 are located in the plastic body 10. Due to the fact that the width of the attaching part 25 is greater than that of the connecting part 26, the transitional part between the two naturally generates a stop effect when cooperating with the plastic body 10, so as to prevent the metal pin 20 from moving in the up and down direction, which is functionally similar to the through hole 23 in Embodiment 1 for restricting the up and down movement of metal pin 20. Thus, one surface of the attaching part 25 and a surface of a portion of the connecting part 26 located in the accommodating region together constitute the first surface 21, and accordingly, the surface on the other side opposite to this first surface 21 constitutes the second surface 22.

Embodiment 4

This embodiment differs from Embodiment 1 in the specific arrangement of the interlocking structure.

Figure 6:
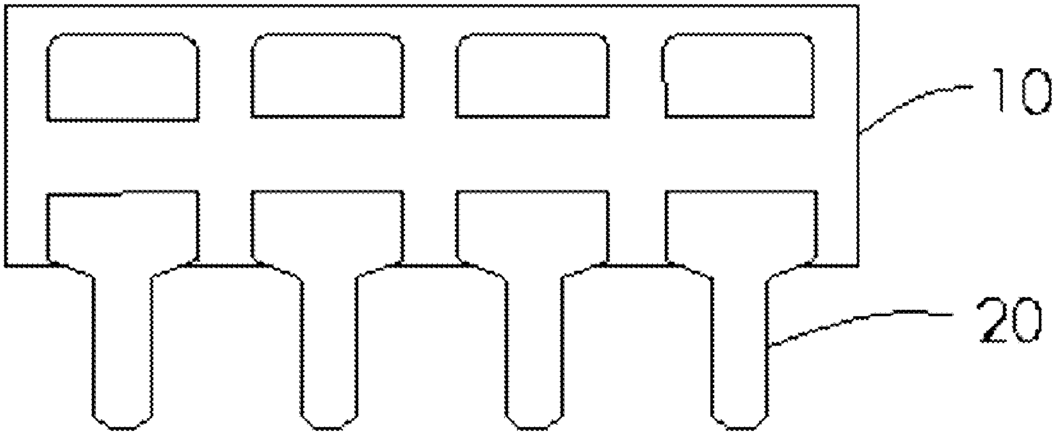
FIG. 6 is a structural view of the pin structure of Embodiment 4 of the present invention.
Figure 7:
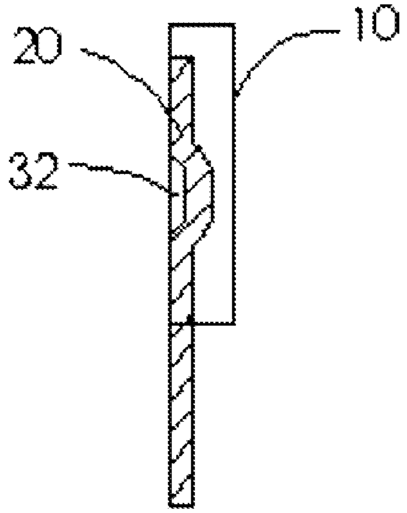
FIG. 7 is a side view of FIG. 6.
Figure 8:
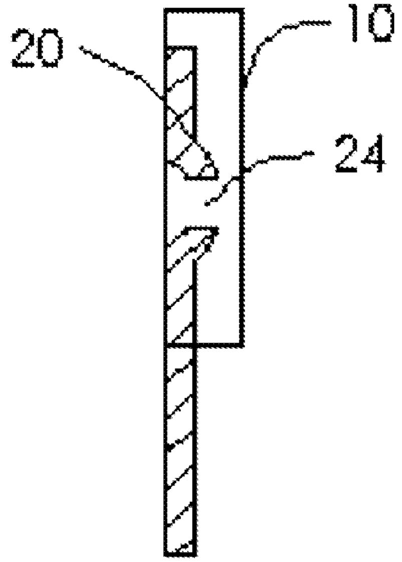
FIG. 8 is a side view of FIG. 6 at the position of the pass hole.

Referring to FIGS. 6-8, in this embodiment, the metal pin 20 is provided with a recess 32, and the plastic body 10 is provided with a protrusion 31. Specifically, one part of the metal pin 20 bends and protrudes towards the plastic body 10, so as to cause the first surface 21 to form a protrusion part, and accordingly cause the second surface to form a recess 32. When the metal pin 20 is integrally formed with the plastic body 10, one part of the plastic body 10 extends into the recess 32, and this part constitutes the protrusion 31. An interlock is formed by the stop fitting between the protrusion 31 and the recess 32, so as to prevent the metal pin 20 from slipping off the plastic body 10 in all of the up and down direction, the front and back direction and the left and right direction.

In this embodiment, the recess 32 extends along a width direction of the metal pin 20, i.e. the left and right direction, and is connected with left and right lateral edges of the metal pin 20. The protrusion 31 also extends along the width direction of the metal pin 20, and the protrusion 31 is connected to two opposite lateral sides of the accommodating region, so as to ensure the effective connection between the protrusion 31 and the plastic body 10 itself.

Optionally, a pass hole 24 is arranged at the location where the metal pin 20 protrudes, i.e. inside the recess 32. The pass hole 24 runs through both sides of the metal pin 20 in the thickness direction. Thus, when the metal pin 20 is integrally formed with the plastic body 10, one part of the protrusion 31 is located in the pass hole 24 and is connected to one side of the accommodating region that faces the first surface 21, to further form an interlock with the pass hole 24, so as to improve the interlocking effect, thereby ensuring the reliability of connection between the metal pin 20 and the plastic body 10.

Preferably, the thickness of the part of the plastic body 10 at the location that corresponds to the protrusion part of the metal pin 20 is greater than or equal to 0.4 mm.

Compared with Embodiment 1, in this embodiment, on the basis that one surface of the metal pin 20 is parallel to and coplanar with one surface of the plastic body 10, the interlocking structure is easy to manufacture. The interlocking structure can be formed by stamping using a mold, which may achieve good quality.

Embodiment 5

This embodiment differs from Embodiment 4 in the manner of bending of the metal pin 20.

Figure 9:
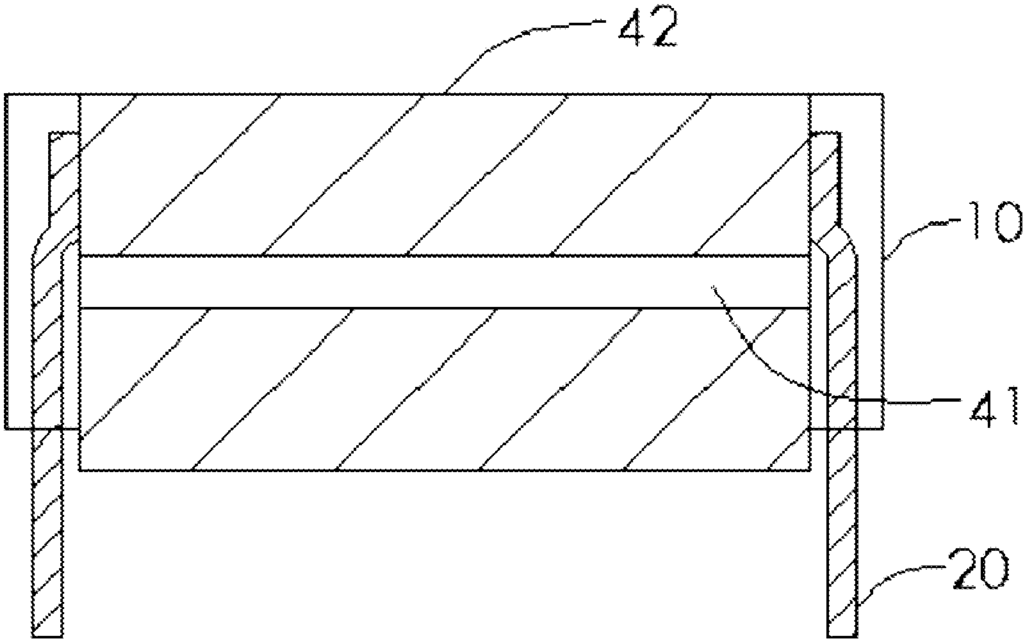
FIG. 9 is a structural view of the module power supply of the present invention adopting the pin structure of Embodiment 5.

In this embodiment, the bending of the metal pin 20 is not in the same manner as that of Embodiment 4 which is in the form of a concave pit, but is entirely bending, as illustrated in FIG. 9. Specifically, the metal pin 20 is bent into a first segment and a second segment, wherein, relative to the first segment, the second segment entirely bends in a direction towards the center of the plastic body 10. Thus, two surfaces of the first segment constitute the first surface 21 and the second surface 22, and one of two surfaces of the second segment on a side away from the center of the plastic body 10 serves as the recess 32, as this surface has a certain distance to the second surface 22 of the first segment in the thickness direction. Accordingly, the plastic body 10 is also provided with a protrusion 31 arranged thereon, the protrusion 31 covers the surface of the second segment on a side away from the center of the plastic body 10. Thus, both surfaces of the second segment are in contact with the plastic body 10, so as to constrain the metal pin 10 in the plastic body 10 and prevent the metal pin 10 from slipping off the plastic body 10 in all of the up and down direction, the front and back direction and the left and right direction.

Preferably, the thickness of the part of the plastic body 10 that covers the second segment on a side away from the center of the plastic body 10 is greater than or equal to 0.4 mm.

When comparing Embodiment 4 with the Embodiment 5, the metal pin 20 of Embodiment 4 may form a better fitting with the side of the product body 40 in practical use, which may facilitate the heat dissipation of the product. When comparing Embodiment 1 with Embodiment 5, the metal pin 20 with a planar form in Embodiment 1 may have a smaller thickness than that of the entirely bending metal pin 20 in Embodiment 5.

Embodiment 6

This embodiment differs from the Embodiment 1 in the specific arrangement of the protrusion 31 and the recess 32.

Figure 10:
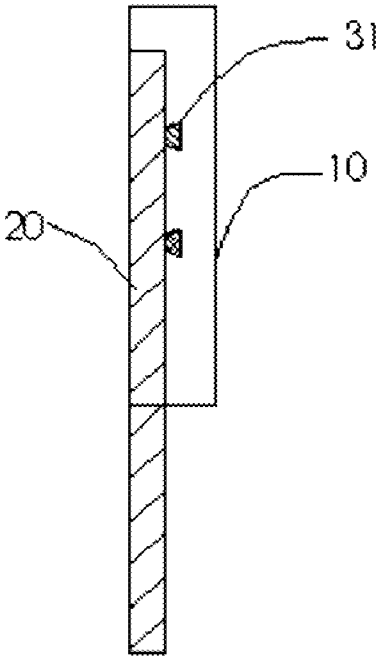
FIG. 10 is a structural view of the pin structure of Embodiment 6 of the present invention.

Referring to FIG. 10, in this embodiment, the metal pin 20 is provided with a protrusion 31 and the plastic body 10 is provided with a recess 32, which are the same as in Embodiment 1. The differences between the two embodiments are that the protrusion 31 in this embodiment is not arranged at the peripheral edge of the metal pin 20, but arranged on the first surface 21. Specifically, the protrusion 31 is arranged on the first surface 21 and protrudes towards the plastic body 10, the recess 32 is provided at a corresponding position on the plastic body 10. When the metal pin 20 is integrally formed with the plastic body 10, the protrusion 31 is located in the recess 32, so as to form an interlock with the recess 32.

In this embodiment, a size of one end of the protrusion 31 adjacent to the first surface 21 is smaller than that of the other end thereof away from the first surface 21. Accordingly, the shape of the recess 32 matches with that of the protrusion 31, thus, side surfaces of the protrusion 31 cooperate with side surfaces of the recess 32 to prevent the protrusion 31 from slipping off the recess 32, so as to prevent the metal pin 20 from slipping off the plastic body 10 in all of the up and down direction, the front and back direction and the left and right direction.

In this embodiment, the cross-section of the protrusion 31 is in a shape of trapezoid, the shorter side of the trapezoid is connected with the first surface 21 to constitute one end that is adjacent to the first surface 21, and the longer side of the trapezoid constitutes the other end that is away from the first surface 21. The sloping side surfaces of the trapezoid matches with the sloping side surfaces of the recess 32, so as to prevent the protrusion 31 from slipping off the recess 32, thereby achieving a reliable connection between the metal pin 20 and the plastic body 10.

Optionally, the pin structure may have one or more protrusions 31 according to the needs. When multiple protrusions 31 are provided, the respective protrusions 31 are arranged in a pattern on the first surface 21, and the specific arrangement positions thereof can be selected according to the needs, for example, the protrusions 31 may be arranged at an edge position or a non-edge position on the first surface 21.

The interlocking structure of this embodiment is manufactured by first producing a metal protrusion 31 and then fixing the metal protrusion 31 onto the metal pin 20 by SMT (Surface Mounted Technology) welding. Due to very small size of the metal protrusions 31, a high level of process control is required using precision etching equipment.

Embodiment 7

This embodiment differs from Embodiment 6 in the specific arrangement of the protrusions 31.

In this embodiment, the cross-section of the protrusion 31 is not in a shape of trapezoid, but bent into a L-shaped structure. Accordingly, the shape of the recess 32 matches with that of the protrusion 31, thus, one end of the L-shaped structure is connected with the first surface, and the other end hooks into the plastic body 10 to prevent the protrusion 31 from slipping off the recess 32, so as to prevent the metal pin 20 from slipping off the plastic body 10, thereby achieving an effect of interlock between the metal pin 20 and the plastic body 10.

Figure 11:
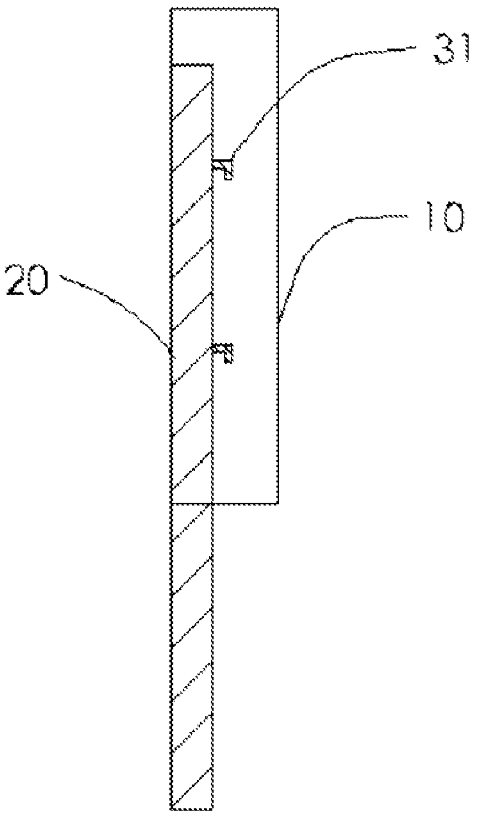
FIG. 11 is a structural view of the pin structure of Embodiment 7 wherein the protrusion is not located at the edge of the first surface.
Figure 12:
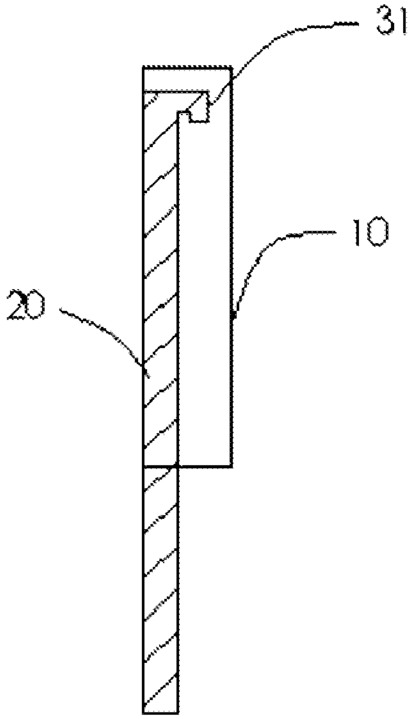
FIG. 12 is a structural view of the pin structure of Embodiment 7 wherein the protrusion is located at the edge of the first surface.

Similar to Embodiment 4, the number of the protrusion 31 and their specific arrangement positions on the first surface can be selected according to the needs, and the protrusion 31 likewise may be arranged at an edge position or a non-edge position on the first surface 21, as illustrated in FIG. 11 and FIG. 12.

When the protrusion 31 is arranged on the edge of the first surface and integrally formed thereon, i.e. when the arrangement as illustrated in FIG. 12 is adopted, the metal pin 20 may be firstly processed by stamping at the periphery to form the peripheral part thereof into a thin sheet, and then bending and folding the thin sheet backward to form an L-shaped protrusion 31.

Optionally, the specific type of connection between the protrusion 31 and the metal pin 20 may be selected according to the needs. Specifically, the protrusion 31 may be formed by bending one part of the metal pin 20, and may also be a component that is separately machined and connected onto the metal pin 20, such as, by welding.

Embodiment 8

This embodiment differs from Embodiments 6 and 7 in the specific structure of the protrusion 31.

Figure 13:
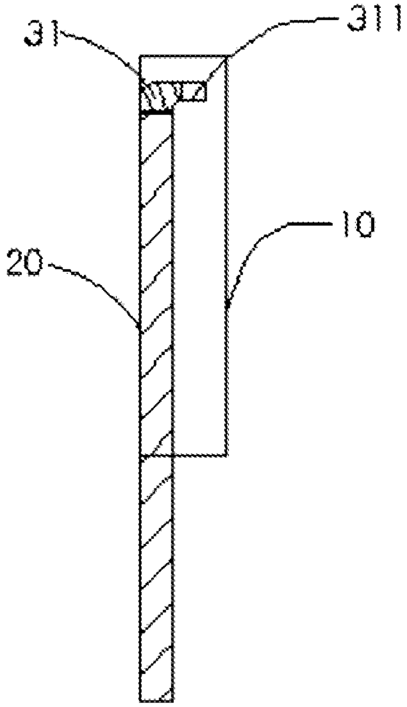
FIG. 13 is a structural view of the pin structure of Embodiment 8 of the present invention.

Referring to FIG. 13, in this embodiment, the protrusion 31 is also provided with a connecting hole 311, but the connecting hole 311 has an axis not vertical with the first surface 21, the connecting hole 311 runs through opposite sides of the protrusion 31. When the metal pin 20 is integrally form with the plastic body 10, one part of the plastic body 10 is located in the connecting hole 311 and cooperates with the connecting hole 311 to further improve the interlocking effect and ensure the reliability of interlock.

Embodiment 9

This embodiment differs from Embodiment 1 in the specific arrangement of the protrusion 31 and the recess 32.

Figure 14:
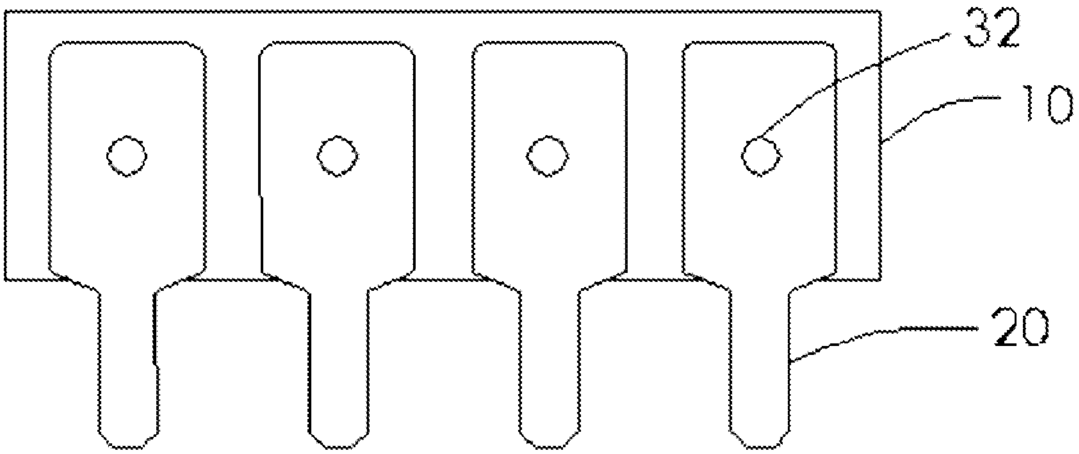
FIG. 14 is a structural view of the pin structure of Embodiment 9 of the present invention.
Figure 15:
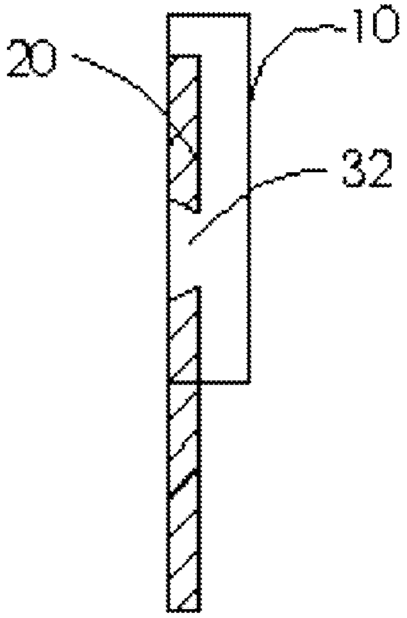
FIG. 15 is a side view of FIG. 14.

Referring to FIG. 14 and FIG. 15, in this embodiment, the metal pin 20 is provided with a joint hole serving as the recess 32, and a diameter of the joint hole is gradually decreasing along a direction towards the plastic body 10. Accordingly, the plastic body 10 is provided with the protrusion 31, and the shape of the protrusion 31 matches with that of the joint hole. Thus, the joint hole cooperates with the protrusion 31 to prevent the metal pin 20 from slipping off the plastic body 10 in the up and down direction and the left and right direction. The shape of the joint hole prevents the protrusion 31 from slipping off the joint hole in the front and back direction, so as to prevent the metal pin 20 from slipping off the plastic body 10 in the front and back direction, thereby achieving a reliable connection between the metal pin 20 and the plastic body 10.

The arrangement described in this embodiment is suitable for metal pins 20 with relative greater thickness. It does not need to process the metal pin 20 by curving and etching, in contrast, only stamping is needed to form such an interlocking structure.

It should be noted that, the above-described cooperation between the protrusion 31 and the recess 32 is a cooperation after the metal pin 20 and the plastic body 10 have been integrally formed together. The arrangements in the above embodiments can be combined with each other or substituted by each other.

It should be noted that the term "plurality" mentioned in the above embodiments refers to at least two.

It can be seen from the above description that, the technical effects achieved by the above embodiments of the present invention include:

1. It solves the problems in the prior art that the pin thickness of a module power supply is relatively thick and that the metal pins are difficult to weld and assemble;
1. It adopts an interlock relation to achieve a reliable connection between the plastic body and the metal pin, which reduces the frequency of pin assembling, so as to achieve convenient and fast assembling, and also helps to prevent the metal pin from falling off from the plastic body and improve the resistance to mechanical vibration after the pin assembling;

2. It allows the metal pin to be directly in contact with the product, so as to ensure good heat dissipation performance while ensuring the reliability of connection between the metal pin and the plastic body;

3. It has the thickness of the pin structure being equal to the sum of the thickness of the metal pin and the thickness of the plastic body on one side of the metal pin, therefore, when the product size is certain, the layout size of the Printed Circuit Board (PCB) is increased, and, since the molded pin thickness is reduced, a reduced overall product size can be realized.

Apparently, the embodiments described above only represent part of the embodiments of the present invention, not all of them. Based on the embodiments described in the present invention, all other embodiments obtainable by a person with ordinary skill in the art without expenditure of creative labor shall fall within the scope of protection of the present invention.

It should be noted that the terms used herein are only intended to describe the specific implementation ways, but not intended to limit exemplary implementation ways under this disclosure. As used herein, the singular form is also intended to cover the plural form unless the context expressly indicates otherwise, and it should also be understood that, when the terms "include" and/or "comprise" are used in this specification, these terms indicate the presence of features, steps, operations, devices, components and/or combinations of them.

It should be noted that, in the specification and claims of this application and the above-mentioned drawings, the terms "first", "second", etc. are used to distinguish similar objects and are not necessarily used to describe a particular order or precedence. It should be understood that the data thus used are interchangeable where appropriate, so that the embodiments of the present disclosure described herein can be implemented in an order other than those illustrated or described herein.

The above are only preferred embodiments of the present invention and are not intended to limit the present invention. For those skilled in the art, the present invention may be subject to various modifications and variations. Any modification, equivalent substitution, improvement, etc. made within the spirit and principles of the present invention shall be included in the scope of protection of the present invention.

What is claimed is:

1. A pin structure of a module power supply comprising a plastic body, provided with an accommodating region;

a metal pin, integrally connected with the plastic body and located at the accommodating region; a first surface of the metal pin being attached to the plastic body, and a second surface of the metal pin opposite to the first surface being exposed outside the plastic body;

an interlocking structure, comprising a protrusion and a recess; one of the protrusion and the recess being located on the plastic body, and the other of the protrusion and the recess being located on the metal pin; the protrusion extending into the recess to form an interlock to prevent the metal pin from slipping off the plastic body.

2. The pin structure of the module power supply of claim 1, wherein, the metal pin is provided with the protrusion located at a peripheral edge thereof and extends along the first surface, and a thickness of the protrusion is less than that of the metal pin, the plastic body is provided with the recess; the protrusion is continuously arranged along a periphery of the metal pin, or the pin structure comprises a plurality of the protrusions arranged along a periphery of the metal pin at intervals.

3. The pin structure of the module power supply of claim 2, wherein, a difference between a thickness of the protrusion and a thickness of the metal pin is greater than or equal to 0.4 mm.

4. The pin structure of the module power supply of claim 2, wherein, the metal pin is provided with a through hole and one part of the plastic body is located in the through hole.

5. The pin structure of the module power supply of claim 2, wherein, the metal pin comprises an attaching part and a connecting part, and the attaching part and at least a portion of the connecting part are arranged in the accommodating region; one surface of the attaching part and a surface of a portion of the connecting part constitute the first surface.

6. The pin structure of the module power supply of claim 1, wherein, one part of the metal pin bends and protrudes in a direction towards a center of the plastic body, and one side of the bending protruding part of the metal pin that is away from the center of the plastic body serves as the recess, and the plastic body is provided with the protrusion.

7. The pin structure of the module power supply of claim 6, wherein, the recess is located on the second surface, the recess and the protrusion both extend along a width direction of the metal pin, and the protrusion is connected to two opposite lateral sides of the accommodating region.

8. The pin structure of the module power supply of claim 6, wherein, a pass hole is provided at a location where the metal pin protrudes, and one part of the protrusion is located in the pass hole and is connected to one side of the accommodating region that faces the first surface.

9. The pin structure of the module power supply of claim 6, wherein, the metal pin comprises a first segment and a second segment that bend in sequence, the second segment bends in a direction towards the center of the plastic body, the first segment has the first surface and the second surface; both surfaces of the second segment are in contact with the plastic body, and one side of the second segment away from the center of the plastic body serves as the recess.

10. The pin structure of the module power supply of claim 6, wherein, a thickness of the part of the plastic body that corresponds to the bending protruding part of the metal pin is greater than or equal to 0.4 mm.

11. The pin structure of the module power supply of claim 1, wherein, the metal pin is provided with the protrusion located on the first surface and protruding towards the plastic body, and the plastic body is provided with the recess; the protrusion is integrally formed with the metal pin, or the protrusion is separately machined and connected to the metal pin.

12. The pin structure of the module power supply of claim 11, wherein, a size of one end of the protrusion adjacent to the first surface is smaller than that of the other end thereof away from the first surface; and/or the protrusion bends and hooks into the recess.

13. The pin structure of the module power supply of claim 11, wherein, the protrusion is provided with a connecting hole having an axis not vertical with the first surface, and one part of the plastic body is located in the connecting hole.

14. The pin structure of the module power supply of claim 1, wherein, the metal pin is provided with a joint hole serving as the recess, and a diameter of the joint hole is gradually decreasing along a direction towards the plastic body, and the plastic body is provided with the protrusion.

15. A module power supply, comprising
a product body, and
a plurality of pin structures according to claim 1,
wherein, both opposite sides of the product body are provided with the pin structures.

* * * * *